United States Patent
Carswell

(10) Patent No.: US 7,148,429 B2
(45) Date of Patent: Dec. 12, 2006

(54) ENVIRONMENTAL PROTECTION OF SERIAL ATA AND OTHER ELECTRONIC DEVICES

(75) Inventor: Samuel A. Carswell, Moorestown, NJ (US)

(73) Assignee: Formation, Inc., Moorestown, NJ (US)

( * ) Notice: Subject to any disclaimer, the term of this patent is extended or adjusted under 35 U.S.C. 154(b) by 0 days.

(21) Appl. No.: 10/877,111

(22) Filed: Jun. 25, 2004

(65) Prior Publication Data

US 2004/0264149 A1   Dec. 30, 2004

Related U.S. Application Data

(60) Provisional application No. 60/482,826, filed on Jun. 26, 2003.

(51) Int. Cl.
*H01R 12/14* (2006.01)
*H05K 1/11* (2006.01)

(52) U.S. Cl. .................. 174/262; 174/261; 174/52.3

(58) Field of Classification Search ............... 361/752, 361/800, 797, 760, 730, 736, 792–795, 816, 361/818; 174/52.1–52.3, 35 R, 35 MS, 35 GC
See application file for complete search history.

(56) References Cited

U.S. PATENT DOCUMENTS

| | | | |
|---|---|---|---|
| 5,061,193 A | | 10/1991 | Seaman |
| 5,313,371 A | * | 5/1994 | Knecht et al. ............... 361/818 |
| 5,739,463 A | * | 4/1998 | Diaz et al. ................. 174/35 R |
| 5,844,781 A | | 12/1998 | Schlotterer et al. |
| 5,929,629 A | * | 7/1999 | Hiraoka et al. ............. 324/174 |
| 6,239,359 B1 | * | 5/2001 | Lilienthal et al. ...... 174/35 GC |
| 6,270,375 B1 | | 8/2001 | Cox et al. |
| 6,300,565 B1 | * | 10/2001 | Loibl et al. ................. 174/52.3 |
| 6,390,840 B1 | | 5/2002 | Wang |
| 6,447,459 B1 | * | 9/2002 | Larom ......................... 600/538 |
| 6,472,609 B1 | * | 10/2002 | Wakako et al. ............. 174/255 |
| 6,480,020 B1 | | 11/2002 | Jung et al. |
| 6,859,119 B1 | * | 2/2005 | Eliacin et al. ............... 333/262 |
| 2003/0006069 A1 | * | 1/2003 | Takebe et al. ............... 174/263 |
| 2003/0016468 A1 | | 1/2003 | Hayakawa et al. |
| 2003/0045175 A1 | | 3/2003 | Lynch et al. |
| 2003/0189811 A1 | | 10/2003 | Peeke et al. |

OTHER PUBLICATIONS

Advanced Circuitry Materials from Nelco company.*

(Continued)

*Primary Examiner*—Tuan Dinh
(74) *Attorney, Agent, or Firm*—Akin Gump Strauss Hauer & Feld, LLP

(57) ABSTRACT

A system for communicating with an electronic device within a sealed vessel comprises a generally enclosed housing having an opening. A printed circuit board is provided for covering the housing opening to create a fully enclosed sealed vessel. An electronic device is located within the interior of the sealed vessel and an external device is located outside the sealed vessel. At least one conductive path comprised of at least one conductive trace and at least one conductive via extends through the printed circuit board from the first surface located on the outside of the sealed vessel to a second surface located on the inside of the sealed vessel. The conductive path has a first end on the first surface which is connected to the external device and a second end on the second surface which is connected to the electronic device. In this manner, a communication path is established between the external device and the electronic device within the interior of the sealed vessel utilizing the at least one conductive path.

2 Claims, 6 Drawing Sheets

OTHER PUBLICATIONS

"Introduction Serial ATA-Serial ATA The Next Generation Storage Interface", printout from Molex web site: http://www.molex.com/cmc_upload/0/000/0-9/961/intro.html, printout date: Dec. 5, 2003, 2 pages.

* cited by examiner

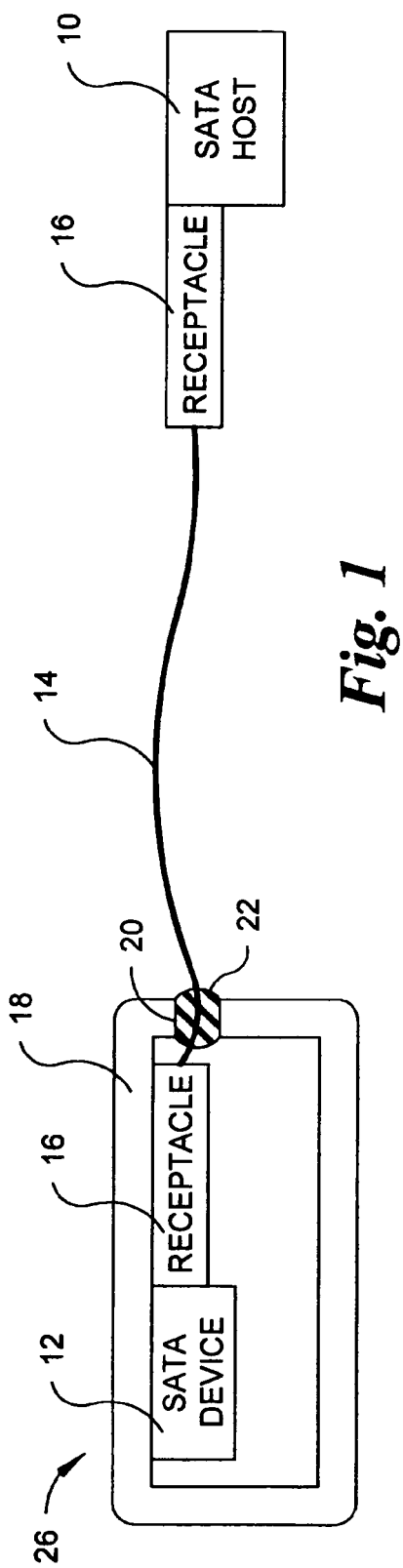
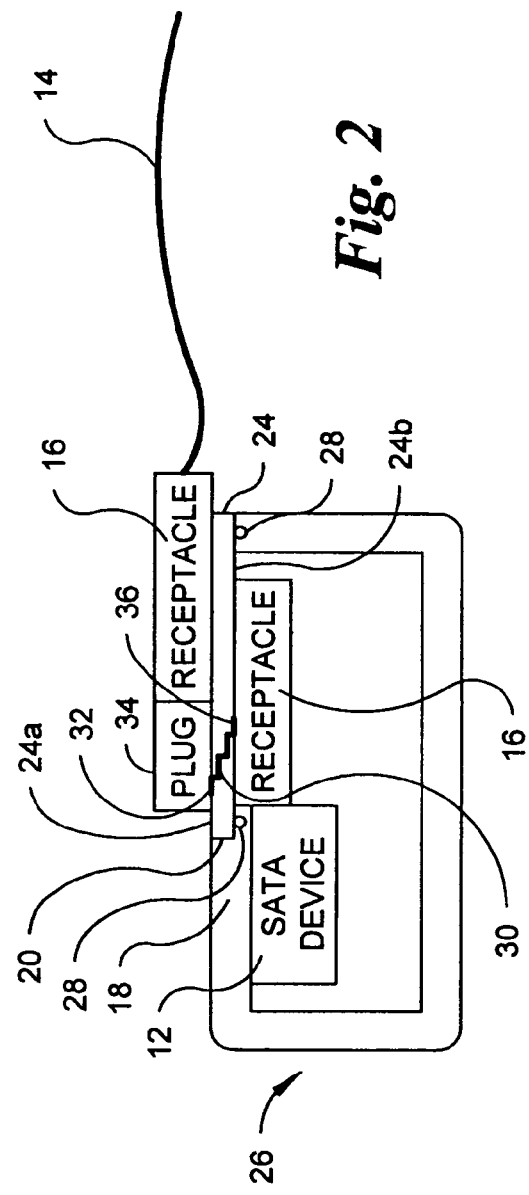

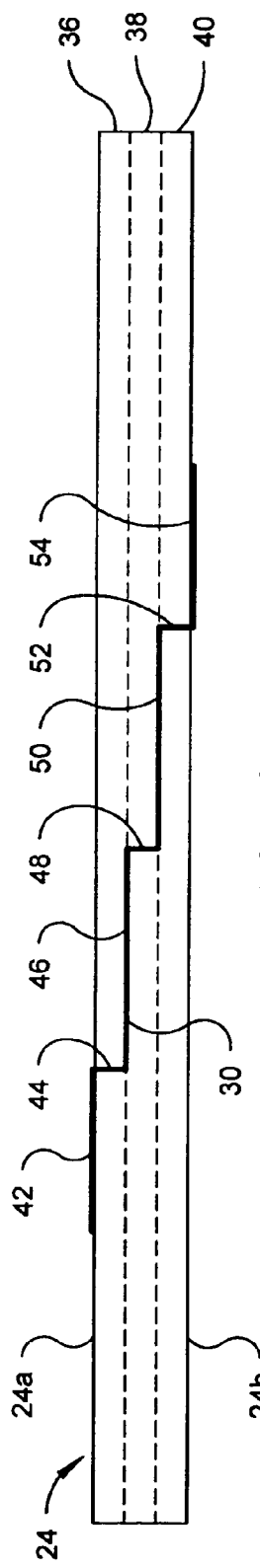
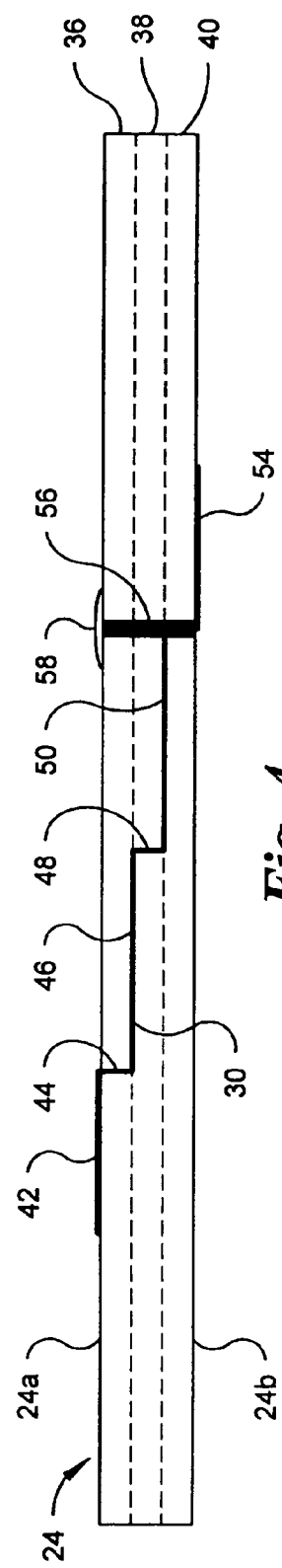
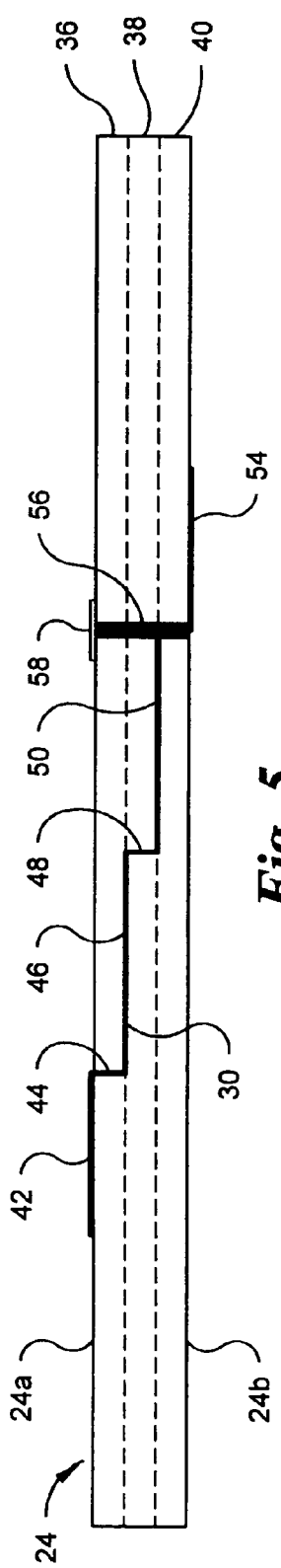

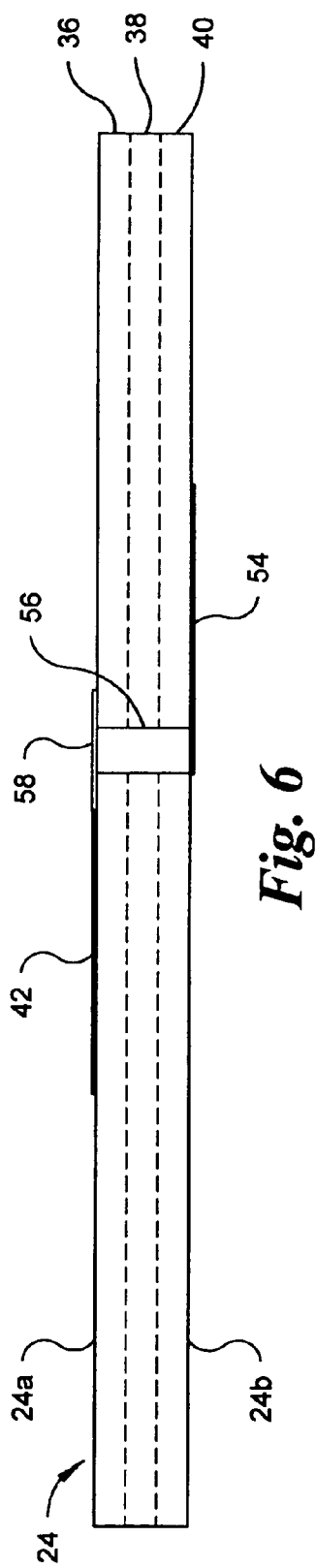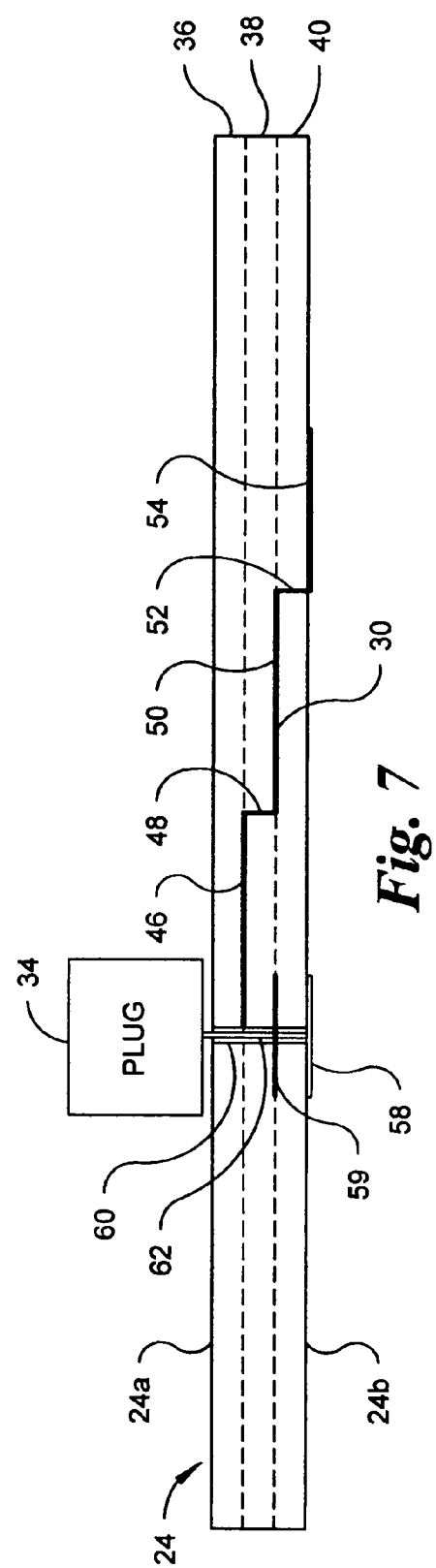

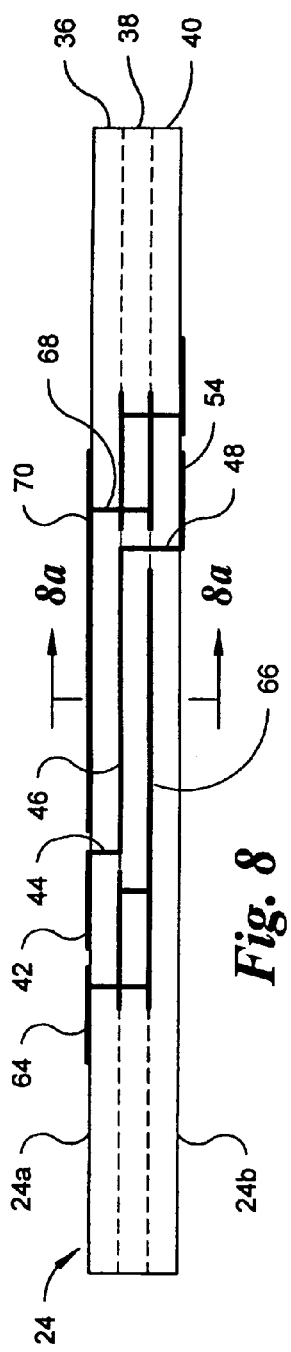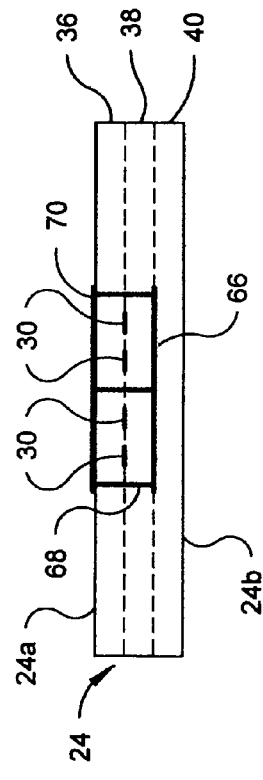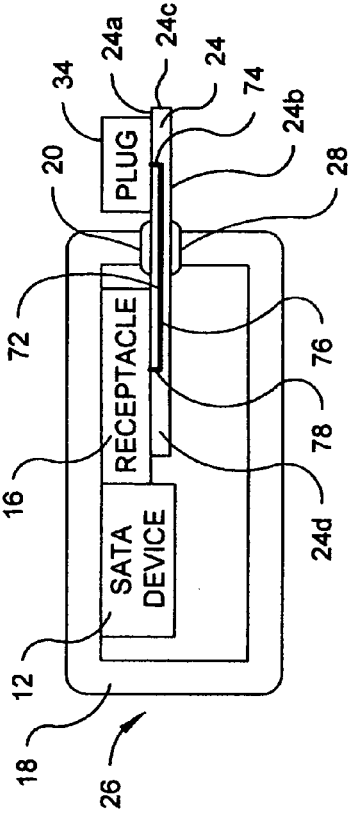

ENVIRONMENTAL PROTECTION OF SERIAL ATA AND OTHER ELECTRONIC DEVICES

CROSS-REFERENCE TO RELATED APPLICATIONS

This application claims the benefit of U.S. Provisional Patent Application No. 60/482,826 filed Jun. 26, 2003 and entitled "Serial EPOD—Environmental Protection of Serial ATA Devices".

BACKGROUND OF THE INVENTION

The present invention relates generally to systems for the environmental protection of serial ATA and other electronic devices and, more particularly, to advanced techniques for providing communication and configuring the operation of such environmentally protected devices.

Serial Advanced Technology Attachment (SATA) provides an interface to attach peripheral and other electronic devices to host computers or other host devices. There is a need to install SATA devices or host devices into harsh environments that exceed the design and operating parameters of the SATA devices or host devices. SATA presents design challenges in providing environmental protection while maintaining a simple and reliable host to device interface. The present invention provides a cost effective solution for such challenges.

Peripheral and other devices operating in harsh environments, such as within the equipment bay of an aircraft, are typically enclosed within a sealed vessel that provides a temperature controlled, dry, constant pressure atmosphere for the device. The peripheral or other device may also be protected with other systems such as vibration isolators or the like. The protection system is monitored and controlled with the objective of maintaining the environment within the operational range of the peripheral or other electronic device and to disable the device if that objective cannot be met.

The present invention resolves two major issues present in environmentally protecting electronic devices: (a) providing reliable electrical connectivity between a SATA host or other host device and the SATA or other electronic device while maintaining at least one device in a temperature controlled, pressurized, dry environment and (b) assuring that the SATA device is only active when the environmental conditions within the sealed vessel are maintained within the operational range of the SATA or other electronic device.

Serial ATA is presented as an example of a modern high-speed electrical interface. The SATA standard is designed to optimize the performance/price ratio. Optimization is partly accomplished by leaving only a small margin for signal degradation within the cabling and connectors used for sending signals to and receiving signals from the SATA device. Such a small signal degradation margin requires innovation when transmitting electrical signals at 3 GHz. The SATA standard addresses this by specifying twinax cables (shielded differential lines). This type of cable or any other high-speed impedance controlled solution is difficult to feed into a seal vessel.

Hermetically sealed connectors are the classic solution used to feed electrical signals into a sealed vessel that contains electronic equipment. Such sealed connectors are expensive and offer primarily basic pin and socket electrical contacts that present a risk of Radio Frequency (RF) emission and susceptibility problems. Sealed twinax connectors are a better electrical solution but are rare and expensive.

The present invention utilizes specific printed circuit materials, conductive trace and via routing techniques, and sealing methods to create a pressure and moisture barrier that is capable of conducting the electrical signals into and out of a sealed environmentally controlled vessel. These materials and techniques resolve normal Printed Circuit Board (PCB) and flexible printed circuit leakage caused by both porous barrels of plated vias and moisture permeable laminate materials. The invention is applicable to any electronic device but is especially useful for high frequency signals such as those associated with SATA devices.

The second issue addressed by the present invention is to assure that the SATA device only operates when specified environmental conditions are met. This is typically accomplished in the prior art by removing power to the SATA device or requesting the SATA host to not communicate over the SATA PHY (Physical layer) interface. Such solutions require specialty power supplies or customized host software. The present invention accomplishes the same result by incorporating a PHY block circuit between the SATA device within the sealed environmentally protected vessel and the SATA host that disrupts communication over the interface. The PHY block circuit is controlled out-of-band by an environmental controller which monitors the environmental parameters such as temperature, pressure, etc. within the sealed vessel. The environmental controller has independent control over the operational state of the SATA device since, per the SATA specification, the device is inactive if the PHY interface is not established.

SUMMARY OF THE INVENTION

Briefly, stated the present invention, in one embodiment, comprises a system for communicating with an electronic device within a sealed vessel, comprising a generally enclosed housing having an opening. A printed circuit board, fabricated using special materials and techniques, covers the housing opening to create a fully enclosed, sealed vessel. An electronic device is located within the interior of the sealed vessel and an external device, such as a host device is located outside of the sealed vessel. At least one conductive path extends through the printed circuit board from a first surface located outside of the sealed vessel to a second surface located inside of the sealed vessel. The at least one conductive path has a first end on the first surface which is connected to the external device and a second end on the second surface which is connected to the electronic device within the sealed vessel. In this manner, a communication path is established between the external device and the electronic device within the interior of the sealed vessel utilizing the at least one conductive path.

In another embodiment, the present invention comprises a system for communicating with an electronic device within a sealed vessel comprising a generally enclosed housing having an opening. A printed circuit board or flexible printed circuit, fabricated using special materials and techniques, extends through the housing opening so that a first portion of the printed circuit extends out of the housing and a second portion of the printed circuit extends into the housing. The printed circuit includes first and second surfaces which are sealed to the housing to create a fully enclosed, sealed vessel. An electronic device is located within the interior of the sealed vessel and an external device is located outside of the sealed vessel. The at least one conductive path extends along the interior of the printed circuit between the first and second portions. At least one conductive path has a first end on one of the surfaces of the first portion of the printed circuit connected to the external device and a second end on one of the surfaces of the second portion of the printed circuit connected to the electronic device. In this manner, a communication path is established between the external device and the electronic device within the interior of the sealed vessel utilizing the at least one conductive path.

In yet another embodiment the present invention comprises a system for communicating with a SATA device within a sealed environmentally controlled vessel. The system includes a sealed vessel having an environmentally controlled interior with a SATA device within the interior of the sealed vessel. A host device is located outside of the sealed vessel and a communication path extends between the host device and the SATA device within the interior of the sealed vessel. An environmental controller monitors at least one environmental condition within the sealed vessel, compares the monitored environmental condition to a predetermined standard and generates output signals. A physical layer blocker circuit is connected to the environmental controller and to the communication path between the host device and the SATA device. The physical layer blocker circuit receives the output signals from the environmental controller, enables the communication path when the monitored environmental conditions meet the predetermined standard and disables the communication path when the monitored environmental condition does not meet the predetermined standard.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 1 is a schematic diagram illustrating the problem involved with sealing an electrical interface as it enters a closed vessel; especially when the cable is of twinax construction;

FIG. 2 is a schematic diagram illustrating a first preferred embodiment of the present invention in which a printed circuit board is used to enclose and seal a vessel containing a device;

FIG. 3 is a greatly enlarged sectional view of the printed circuit board of FIG. 2 showing the path of a conductive trace;

FIG. 4 is a view similar to that of FIG. 3 illustrating a first alternative embodiment for the conductive trace of the printed circuit board;

FIG. 5 is a view similar to that of FIG. 3 but illustrating a second alternative embodiment of the conductive trace of the printed circuit board;

FIG. 6 is a view similar to that of FIG. 3 but illustrating a third alternative embodiment of the conductive trace of the printed circuit board;

FIG. 7 is a view similar to that of FIG. 3 but illustrating a fourth alternative embodiment of the conductive trace of the printed circuit board;

FIGS. 8 and 8a are views similar to that of FIG. 3 but illustrating a fifth alternative embodiment of the conductive trace of the printed circuit board in side section and end section;

FIG. 9 is a schematic view of second preferred embodiment of the present invention in which the printed circuit board extends into and out of the sealed vessel;

DETAILED DESCRIPTION OF THE INVENTION

Figure 10:
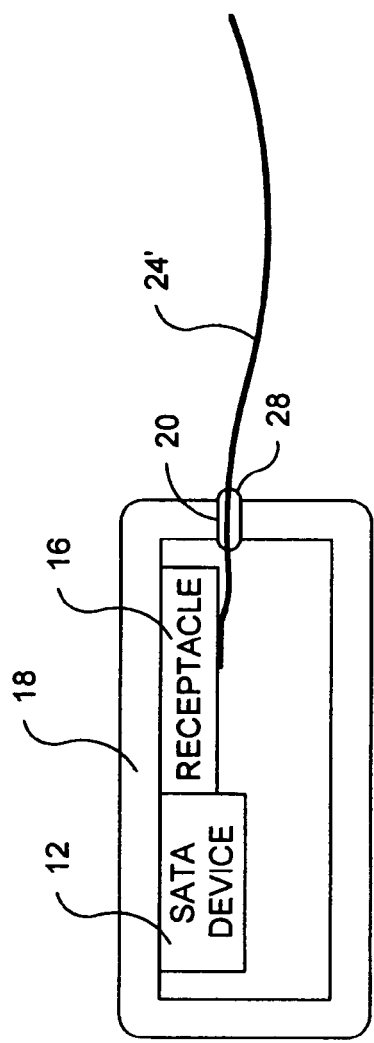
FIG. 10 is a schematic view of third embodiment of the present invention in which a specialized cable is used instead of a printed circuit board.

Referring to the drawings wherein like numerals are used to indicate like elements throughout the several figures, there is shown in FIG. 1 an external device, in the present embodiment a host 10 electrically connected to a device 12 with a cable 14. The cable 14 has a connector receptacle 16 on each end that plugs directly into complimentary connectors or plugs (not shown) integral to the host 10 and device 12. Power for the device 12 is provided by way of a separate cable that has been omitted from all of the drawings for simplicity. A housing 18 surrounds the device 12 and includes an opening 20 through which the cable passes. A simple seal 22 around the cable 14 does not create a moisture and airtight seal since the cable interior wires and shields create multiple egress paths. This is especially true of cable using shield twisted pair or twinax construction. It should be understood that while in the present embodiment the external device is the host 10, the host 10 could be within the housing 18 and the electronic device 12 could be the external device.

FIG. 2 illustrates a first embodiment of the present invention in which a printed circuit board (PCB) 24 is used with a conventional housing 18 to create a sealed vessel 26. The PCB 24 is sealed to the housing 18 to fully cover the opening 20 utilizing a moisture blocking sealant 28 such as PRC-Desoto PR-1440, a sealing O-ring or some other suitable sealing device or technique. If RF emissions or reception control is required an electrically conductive sealant such as PRC-Desoto PR-1564 is used to extend the shield to the housing 18. Preferably, the PCB 24 is formed by one or more substrate layers of air impermeable, low moisture absorbance material such as Park Nelco N-5000.

The PCB 24 includes at least one and preferably two or more conductive paths 30 (only one shown) extending through the PCB 24 from a first surface 24a located outside of the sealed vessel 26 to a second surface 24b located inside of the sealed vessel 26. The conductive path 30 has a first end 32 on the first surface of the PCB which is used for connecting through a suitable plug 34 and the receptacle 16 to the external device or host 10. The conductive path 30 further includes a second end 36 on the second PCB surface 24b connected to the device 12 utilizing the receptacle 16. In this manner, the conductive path 30 is used to provide an airtight, moisture tight connection extending through the PCB 24 for connecting the host 10 to the device 12 within the environmentally controlled interior of the sealed vessel 26 without adversely affecting the sealed nature of the vessel 26 or the protective environment within the sealed vessel 26.

FIG. 3 is an enlarged schematic cross sectional view of a first embodiment of a PCB 24 of the type employed for enclosing the housing 18 to create the sealed vessel 28 as shown in FIG. 2. Only a single conductive path 30 is shown in FIG. 3 for the sake of brevity. However, it will be appreciated by those of ordinary skill in the art that two or more conductive paths 30 may be provided for making all of the necessary electrical connections. The conductive path 30 as shown in FIG. 3 is comprised of seven conductive elements which as described below are connected together, at least electrically, to form a complete conductive path from the first PCB surface 24a to the second PCB surface 24b. In the embodiment illustrated in FIG. 3, the PCB 24 is formed of three laminated layers of substrate material 36, 38 and 40 with the exposed surface of the first substrate layer 36 forming the PCB outer surface 24a and the exposed surface of the third substrate layer 40 forming the PCB inner surface 24b. A greater or lesser number of PCB substrate layers may be employed for particular applications. A first conductive trace element 42 is located on the exposed surface of the first PCB substrate layer 36 and extends generally parallel to the first PCB surface 24a. The first conductive trace element 42 is connected to the plug 34 on the first PCB surface 24a. The second conductive element is a blind via 44 which has a first end connected to the first trace element 42 and extends completely through the first PCB substrate layer 36. The third conductive element is a conductive trace 46 which is connected to the second end of the blind via 44 and extends within the area between the first and second PCB substrate layers 36, 38 and generally parallel to the first PCB surface 24a. The fourth element is a buried via 48 which has a first end connected to conductive trace element 46 and extends through the second PCB substrate layer 38. The fifth element is a conductive trace 50 which is connected to the second end of the buried via 48 and extends along the second substrate layer 38 and generally parallel to the first PCB surface 24a. If the PCB 24 contains only two substrate layers 36, 38 then the fifth conductive trace element 50 would be on the second PCB surface 24b for connection to the device 12. However, in the embodiment shown in FIG. 3, the PCB 24 includes three substrate layers 36, 38 and 40. Accordingly, a sixth conductive trace element is another blind via 52 which extends through the third PCB substrate layer 40 with a first end connected to conductive trace element 50. A seventh element is a conductive trace 54 which is connected to a second end of the blind via 52 and extends along the exposed surface of the third PCB substrate layer 40. In the embodiment shown in FIG. 3, the seventh conductive element is connected to the receptacle 16 associated with the device 12. By forming the conductive path 30 with multiple types of interconnected trace and via elements, the integrity of the sealed vessel 26 is maintained since the horizontal sections provide sealing and the vertical sections migrate the connection between the first PCB surface 24a and the second PCB surface 24b. Preferably, the PCB substrate layers 36, 38 and 40 are fused during the lamination process to provide a tight seal around the various conductive trace elements there between. Preferably, a lamination technique using heat and pressure cure of B-stage outer substrate layers 36 and 40 fused to the A-stage inner core substrate layer 38 is employed to avoid the use of adhesives that could potentially introduce a path for gas leakage or moisture absorption into or out of the sealed vessel 26.

There are times when a through-via may be advantageous despite the potential introduction of a path for fluid leakage around the barrel of the via. FIG. 4 illustrates a first alternate embodiment of the PCB 24 of FIG. 2 which makes the use of a through via 56 which extends completely through the PCB 24 from the first or outer surface 24a to the second or inner surface 24b. The through via 56 essentially takes the place of the blind via 52 as shown in FIG. 3. At least one end of the through via 56 in the present embodiment the end proximate to the first PCB surface 24a is sealed utilizing a generally circular sealing member 58 of sealant material. Importantly, the path of electrical conduction does not pass through the sealing member 58, but instead travels from the first PCB surface 24a to the second PCB surface 24b through the various conductive trace and via elements 42, 44, 46, 48, 50 and 54 utilizing only a portion of the through via 56 to interconnect conductive elements 50 and 54. The sealing member 58 is sufficient to protect the integrity of the sealed vessel 26. If desired, the sealing member 58 could be placed on the second PCB surface 24b or sealing members could be used on both PCB surfaces 24a and 24b to cover both ends of the through via 56. Again, the purpose of the sealing member 58 is to make sure that the sealed vessel 26 remains airtight to protect the controlled environment interior within the sealed vessel 26.

FIG. 5 is an enlarged sectional view of another alternative embodiment of a PCB 24 in accordance with the present invention. The PCB 24 of FIG. 5 is substantially the same as that of FIG. 4 including a through via 56 and the various conductive trace and via elements 42, 44, 46, 48, 50 and 54. As with the embodiment shown in FIG. 4, the through via 56 is used to connect together conductive trace element 50 and conductive trace element 54. However, unlike the embodiment shown in FIG. 4, the through via 56 is filled and at least one end of through via 56 includes a sealing member 58. In the present embodiment, the sealing member 58 is formed by copper plating the first PCB surface 24a with a generally circular copper land. If desired, the sealing member 58 could be bonded on the second PCB surface 24b or sealing members 58 could be on both the first and second PCB surfaces 24a and 24b. Again, the sealing member 58 seals any opening in the PCB 24 resulting from the through via 56 in order to maintain the sealed condition of the sealed vessel 26 and the protected environment therein. The sealing member 58 may be installed on either or both of the PCB surfaces 24a and 24b utilizing techniques well known by those of ordinary skill in the art. Although the sealing member 58 is preferably made of copper, it will be apparent to those of ordinary skill in the art that the sealing member 58 could be made of other metallic or non-metallic materials if desired. As with the embodiment shown in FIG. 4, the through via 56 in combination with the various conductive trace and via elements 42, 44, 46, 48 50 and 54 forms a complete conductive path through the PCB 24.

FIG. 6 is a side view of a further alternate environment of the present invention. In the embodiment shown in FIG. 6 the principal conductive path through the PCB 24 is attained by the through via 56 which extends completely through the PCB 24 constructed with one or more substrate layers. However, unlike the above-described embodiments, no labyrinth of interconnected conductive trace and via elements is provided. Instead, only a first conductive trace element 42 extends along the first PCB surface 24a and is in electrical contact with the conductive sealing member 58 installed on the first PCB surface 24a over the through via 56. The sealing member 58 is larger in diameter than the via hole and is bonded to the substrate, forming a seal over the potentially leaky via. Similarly, a conductive trace element 54 is installed on the second PCB surface 24b in electrical contact with the through via 56. If desired, a sealing member 58 could be installed on the second PCB surface 24b or on both PCB surfaces 24a, 24b. The sealing member 58 prevents any leakage through the PCB 24 around the through via 56 to maintain the integrity of the sealed vessel 26.

FIG. 7 is a sectional view of yet another embodiment of the present invention. The embodiment shown in FIG. 7 is also similar to that of FIGS. 4 and 5. However, unlike the previously described embodiments, in FIG. 7 a generally circular plated through hole 60 extends completely through the PCB 24 from the first surface 24a to the second surface 24b. The through hole 60 is formed utilizing techniques well known to those of ordinary skill in the PCB art. A conductive pin member 62 is positioned within the through hole 60 and extends slightly beyond the PCB surface 24a and is connected to a plug 34. The second end of the conductive member 62 as well as the opening of the through hole 60 on the second PCB surface 24a is covered by a sealing member 58 formed of a sealant material of the type described above. Preferably the pin member is soldered to the plated hole 60 so that the solder forms a tight seal for the interior of the via barrel 60 and the exterior of the barrel is sealed by plating from the barrel to one or more sealing rings 59 (between substrate layers 38 and 40) or sealing members 58 extending beyond the barrel and bonded to the substrate layers of the PCB. The electrical path through the PCB 24 is achieved utilizing the conductive member 62 as well a various conductive trace and via elements 46, 48, 50, 52 and 54 in the manner as described above. The sealing member 58 and/or sealing rings 59 maintain the integrity of the sealed vessel 26. It will be apparent that other configurations of conductive trace elements and vias and the like either alone or in combination may be used to form electrical connections through the PCB 24 while maintaining the integrity of the sealed vessel 26.

FIGS. 8 and 8a illustrate, in further detail, an embodiment of the present invention in which four separate signal paths, two for transmit and two for receive are provided by separate parallel conductive paths 30 extending through the PCB 24 in a manner similar to that described above. Each conductive path 30 is comprised of a plurality of individual conductive trace and via elements 42, 44, 46, 48 and 54 as shown in FIG. 8 with each of the conductive elements being in parallel as illustrated by FIG. 8a. In addition, the transmit conductive elements and the receive conductive elements are each surrounded within the PCB 24 by ground planes 64, 66, 70 which are also formed by a series of labyrinth conductive trace and via elements shown generally as 68 and 70. This embodiment of the present invention the PCB 24 is comparable to a grounded sealed connector since both the transmit conductors and the receive conductors are in proximity of the respective ground planes 64, 66, 70. In this manner, the transmission path through the PCB 24 is free of leaks but yet also contains necessary shielding around the signal conductors.

FIG. 9 shows a further alternate embodiment of the present invention in which the PCB 24 is secured within the opening 20 of the housing 18 with a different orientation. As shown in FIG. 9, the PCB 24 extends through the housing opening 20 so that a first portion 24c of the PCB 24 extends out of the housing 18 and a second portion 24d of the PCB 24 extends into the housing 18. The first and second PCB surfaces 24a, 24b include sealing adhesive 28 in the vicinity of the housing opening 20 in order to seal the opening 20 and create the sealed vessel 26. At least one conductive path 72 extends along the interior of the PCB 24 between the first and second portions 24c, 24d. In particular, the conductive path 72 is formed by a first via 74 extending from the first PCB surface 24a through the first PCB substrate layer 36. A conductive trace element 76 is connected to the via 74 and extends generally parallel to the first PCB surface 24a in the area between the first and second PCB substrate layers 36, 38. A second via 78 is connected to the conductive trace element 76 and extends through first PCB substrate layer 36 to the first PCB surface 24a. The connector or receptacle 16 is connected to via 78 and the plug 34 is connected to via 74 to thereby complete the path along the PCB 24 and through the housing opening 20. If desired, the connector receptacle 16 and/or the plug 34 could be located on the second PCB surface 24b. The embodiment disclosed in FIG. 9 provides all of the advantages of maintaining the sealed vessel 26 in its airtight condition since the arrangement of the conductive path 72 is free of any gas or moisture leakage.

FIG. 10 illustrates yet a further embodiment of the present invention in which a flexible printed circuit 24' is employed in place of the PCB 24. The flexible printed circuit 24' employs routing and construction which is similar to that of the PCB embodiments described above, except the substrate layer is constructed using a flexible material such as etched Teflon.

Figure 11:
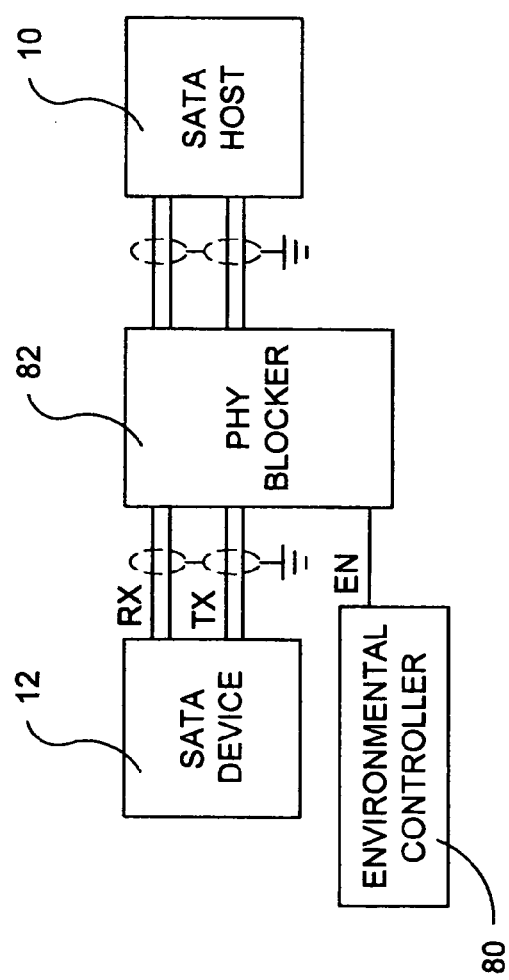
FIG. 11 is a schematic representation of a PHY blocker circuit in accordance with the present invention.

As previously noted, it is desirable to have the ability to conveniently and efficiently assure that the SATA device 12 located within the sealed vessel 26 operates only when the specified environmental conditions are met. FIG. 11 illustrates schematically a preferred structure for accomplishing this result. As shown in FIG. 11 an environmental controller 80 is located within the sealed vessel 26 for the purpose of monitoring at least one and preferably all of the environmental conditions maintained within the sealed vessel 26. The environmental controller 80 compares the monitored environmental condition or conditions to a predetermined standard or set of standards set for the operating conditions of the SATA device 12. The environmental controller 80 generates output signals based upon the comparison of the monitored environmental condition or conditions as compared to the predetermined standard or standards.

A electrical physical layer (PHY) blocker circuit 82 is connected to the environmental controller 80 and to the communication path between the host device 10 and the SATA device 12. Preferably, the PHY blocker circuit 82 is also located within the sealed vessel 26 but, alternatively, it could be located outside of the sealed vessel 28. The PHY blocker circuit 82 receives the output signals from the environmental controller 80 and enables the communication path between the host device 10 and the SATA device 12 as long as the environmental condition or conditions meet the predetermined standard or standards. Correspondingly, the PHY blocker circuit 82 disables the communication path when the monitored environmental condition or conditions do not meet the predetermined standard or standards.

FIG. 12a–12d are functional schematics of four different preferred PHY blocker circuits 82. In the embodiment shown in FIG. 12a, an electronic switch 84 within the PHY blocker circuit 82 receives the output signals from the environmental controller 80 along line EN. As long as the environmental condition or conditions meet the predetermined standard or standards the electronic switch 84 permits the receive and transmit signals of the communication path between the SATA device 12 and the host 10 to function normally. If the monitored environmental condition or conditions do not meet the predetermined standard or standards the output signal received from the environmental controller 80 causes the electronic switch 84 to short together the receive and transmit conductors thereby effectively blocking the communication path between the SATA device 12 and the host device 10.

Figures 12A, 12B, 12C, 12D:
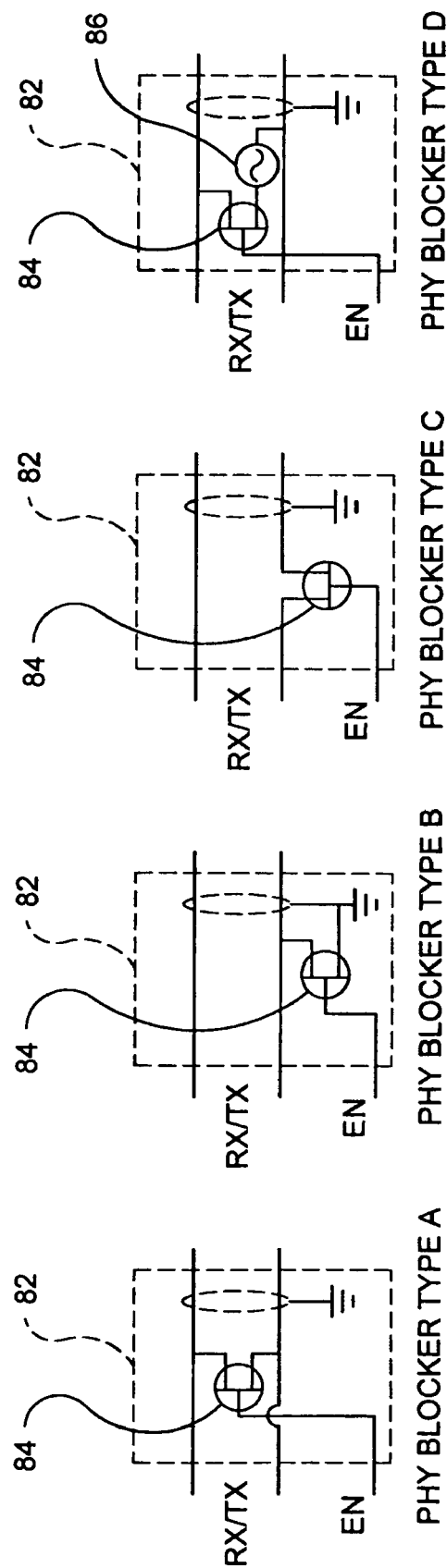
FIGS. 12a and 12b, 12c and 12d illustrate alternative embodiments of the detailed structure of the PHY blocker circuit of FIG. 11.

The embodiment shown in FIG. 12b functions in substantially the same manner as that of the embodiment of FIG. 12a except that when the signal indicating that the environmental condition or conditions do not meet the predetermined standard or standards is received by the electronic switch 84 at least one of the transmit and receive conductors (and preferably both) are shorted to ground to effectively interrupt the communication path between the SATA device 12 and the host device 10. The embodiment shown in FIG. 12c functions in substantially the same manner except that the electronic switch 84 functions to effectively open at least one of the transmit and receive signal paths (and preferably both) to again block the communication path between the SATA device 12 and host device 10. In the embodiment shown in FIG. 12d the electronic switch 84 is connected to a signal generator 86. If the monitored environmental condition or conditions do not meet the predetermined standard or standards the electronic switch 84 functions to inject a disruptive signal from the signal generator 86 into one of the receive and transmit signal lines (and preferably both) to again effectively block the communication path between the SATA device 12 and the host device 10. Other techniques known to those of ordinary skill in the art may be employed for blocking the communication path.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. A system for communicating with an electronic device within a sealed vessel comprising:
    a generally enclosed housing having an opening;
    a printed circuit board comprising at least two laminated substrate layers covering the housing opening to create a fully enclosed, sealed vessel;
    an electronic device within the interior of the sealed vessel;
    an external device outside of the sealed vessel; and
    at least one conductive path extending through the printed circuit board from a first surface located outside of the sealed vessel to a second surface located inside of the sealed vessel, the at least one conductive path comprising at least five conductive elements, a first conductive trace element located on the first surface of the first layer of the printed circuit board, a first blind via connected to the first conductive trace element and extending through the first substrate layer of the printed circuit board, a second conductive trace element connected to the first blind via and extending between the first substrate layer of the printed circuit board and a second substrate layer of the printed circuit board, a second blind via connected to the second conductive trace element and extending through the second substrate layer of the printed circuit board, and a third conductive trace element connected to the second blind via and located on the second surface of the second substrate layer of the printed circuit board, the external device being connected to the first conductive trace element and the electronic device being connected to the third conductive trace element, whereby communication is established between the external device and the electronic device within the interior of the sealed vessel utilizing the at least one conductive path.

2. The system as recited in claim 1, wherein the printed circuit board further comprises a series of conductive trace and via elements which extend on, through and between the layers of the printed circuit board to form a shield around at least a portion of the at least one conductive path.

* * * * *